United States Patent [19]

Yamasaki

[11] Patent Number: 5,063,309

[45] Date of Patent: Nov. 5, 1991

[54] HIGH FREQUENCY CONTINUOUS TIME FILTER

[75] Inventor: Richard G. Yamasaki, Torrance, Calif.

[73] Assignee: Silicon Systems, Inc., Tustin, Calif.

[21] Appl. No.: 500,778

[22] Filed: Mar. 28, 1990

[51] Int. Cl.[5] .......................... H03K 5/00; H04B 1/00
[52] U.S. Cl. .................................... 307/521; 328/167; 333/166
[58] Field of Search ................. 307/520, 521; 328/165, 328/167; 333/166, 178

[56] References Cited

U.S. PATENT DOCUMENTS

| | | | |
|---|---|---|---|
| 4,521,702 | 6/1985 | Kleinberg | 307/521 |
| 4,691,171 | 9/1987 | Van Roermund et al. | 307/521 |
| 4,888,502 | 12/1989 | Jarrett | 307/521 |
| 4,945,311 | 7/1990 | Smith | 307/521 |

Primary Examiner—Stanley D. Miller
Assistant Examiner—Richard Roseen
Attorney, Agent, or Firm—Hecker & Harriman

[57] ABSTRACT

A high-frequency integrated circuit continuous time low pass filter. An on-chip oscillator is built into the filter. The filter frequency accuracy is established by trimming the frequency of the on-chip oscillator during wafer probe. The oscillator is off during normal operation of the filter. Therefore, the filter does not produce noise that will degrade the performance of the filter during normal operation. After trimming, the filter design is such that accuracy is maintained even during temperature and power supply changes. The adjustment can be made without the oscillator by direct measurement of the filter response.

15 Claims, 2 Drawing Sheets

HIGH FREQUENCY CONTINUOUS TIME FILTER

BACKGROUND OF THE INVENTION

1. Field of the Invention

This invention relates to the field of high frequency filters.

2. Background Art

A high frequency continuous time integrated circuit bandpass filter is comprised of a number of filter sections. These filter sections are, in effect, "RC" circuits in which the resistance (R) and the capacitance (C) of the filter element affect the timing accuracy of the filter itself. In the prior art, these filters have been constructed of discrete elements where each element has an accuracy within a desired range. When implementing a filter in an integrated circuit, however, variations in resistance and capacitance can occur. Thus, the accuracy of an integrated circuit filter varies with the R and C of the integrated circuit. It is desired to compensate for these variations to provide an accurate, predictable, stable filter.

One prior art attempt to compensate for variations in the resistance and capacitance of filter elements is to use a "master/slave" approach employing a reference frequency generator. The transconductance (gm) and phase shift of the "slave" filter sections is controlled by a "master" filter or oscillator referenced to an accurate frequency $F_R$. Total filter accuracy is maintained by continuously applying the frequency reference $F_R$. A disadvantage of these prior art filters is the fact that the reference frequency $F_R$ is a noise source that can affect the signal that is being filtered. Such prior art filters are described in "Gyrator Video Filter IC with Automatic Tuning," Moulding, K. W. et al., IEEE JSCC, Vol. SC-15 No. 6, December 1980, and "Design and Performance of a Fully Integrated Bipolar 10.7 MHz Analog Bandpass Filter," Chi-Fa, Chiou, and Rolf Schaumann, IEEE JSCC, Vol. SC-21, February 1986.

Other prior art high frequency continuous time IC filters do not use a "master/slave" approach using a reference frequency. In these other prior art filters, a filter's accuracy is established by trimming an external resistor. Such a filter is described in "Single-Chip Y/C Signal-Processing LSI for 8 mm VCR System," Yamaguchi et al., IEEE BCTM, 1987. This technique does not provide a solution for variations in capacitance which can affect filter performance.

Therefore, it is an object of the present invention to provide a high frequency continuous time filter that does not rely on an applied reference frequency during operation.

It is yet another object of the present invention to provide a high frequency continuous time filter that maintains its accuracy over temperature changes.

It is still another object of the present invention to provide a high frequency continuous time filter that maintains its accuracy during power supply changes.

SUMMARY OF THE INVENTION

The present invention is a high-frequency integrated circuit continuous time low pass filter. An on-chip oscillator is built into the filter. The filter frequency accuracy is established by trimming the frequency of the on-chip oscillator during wafer probe operations. The oscillator is off during normal operation of the filter. Therefore, the filter does not produce noise that will degrade the performance of the filter during normal operation. After trimming, the filter design is such that accuracy is maintained even during temperature and power supply changes.

Both the resistance (R) and the capacitance (C) of filter elements affect the timing accuracy of continuous time, high frequency filters. The present invention provides a method and apparatus for compensating for variations in capacitance during fabrication by "fine tuning" the resistance of a filter. The filters are comprised of one or more transmit resistance elements which have a resistance given by $R_{B1}$. A separate current-generating circuit has a resistance $R_{B2}$ that is closely matched to $R_{B1}$. The resistances $R_{B1}$ and $R_{B2}$ are integrated circuit base resistors which have large absolute value tolerance, but closely match each other. The equivalent capacitance of the filter is proportional to current $I_2$. The current $I_2$ is made proportional to an accurate external resistor $R_X$.

A frequency of a reference oscillator or filter that operates similar to a filter section is used to tune the filter. The frequency of the filter element is measured during wafer probe and is adjusted by trimming one or both of the resistors so that the ratio of the current in $R_X$ and current $I_2$ reaches the desired reference value. The reference oscillator can then be disabled so that during normal operation no background noise occurs. If desired, $I_2$ can also be controlled by an external digital to analog converter, making the filter electronically programmable. The trimming can also accomplished by using a circuit other than an oscillator or by directly measuring the filter frequency response.

DETAILED DESCRIPTION OF THE INVENTION

The present invention is a programmable integrated circuit high frequency continuous time filter. In the following description, numerous specific details are set forth to provide a more thorough description of the present invention. It will be apparent, however, to one skilled in the art, that the present invention may be practiced without these specific details. In other instances, well known features have not been described in detail so as not to obscure the present invention.

In the prior art, filters are built of gm amplifiers and a capacitor to make an RC time constant. Because the resistance is variable, the prior art attempts to create an accurate filter utilizing an external equivalent resistance which can be made accurate. However, to make an accurate filter, both R and C have to be accurate. The prior art has the disadvantage of an unknown capacitance. The present invention effectively corrects the circuit for a C value by running an oscillator in connection with the capacitor. The frequency is checked and by tuning the resistance and trimming a ratio current, the frequency can be tuned. The gain of the current is trimmed. Once the resistor is trimmed to the right frequency, the reference oscillator is depowered. The present invention may be used in applications (such as disk drive read channels) where signal levels are very low. Therefore, by eliminating interference, signal reading difficulties are reduced.

Figure 3:
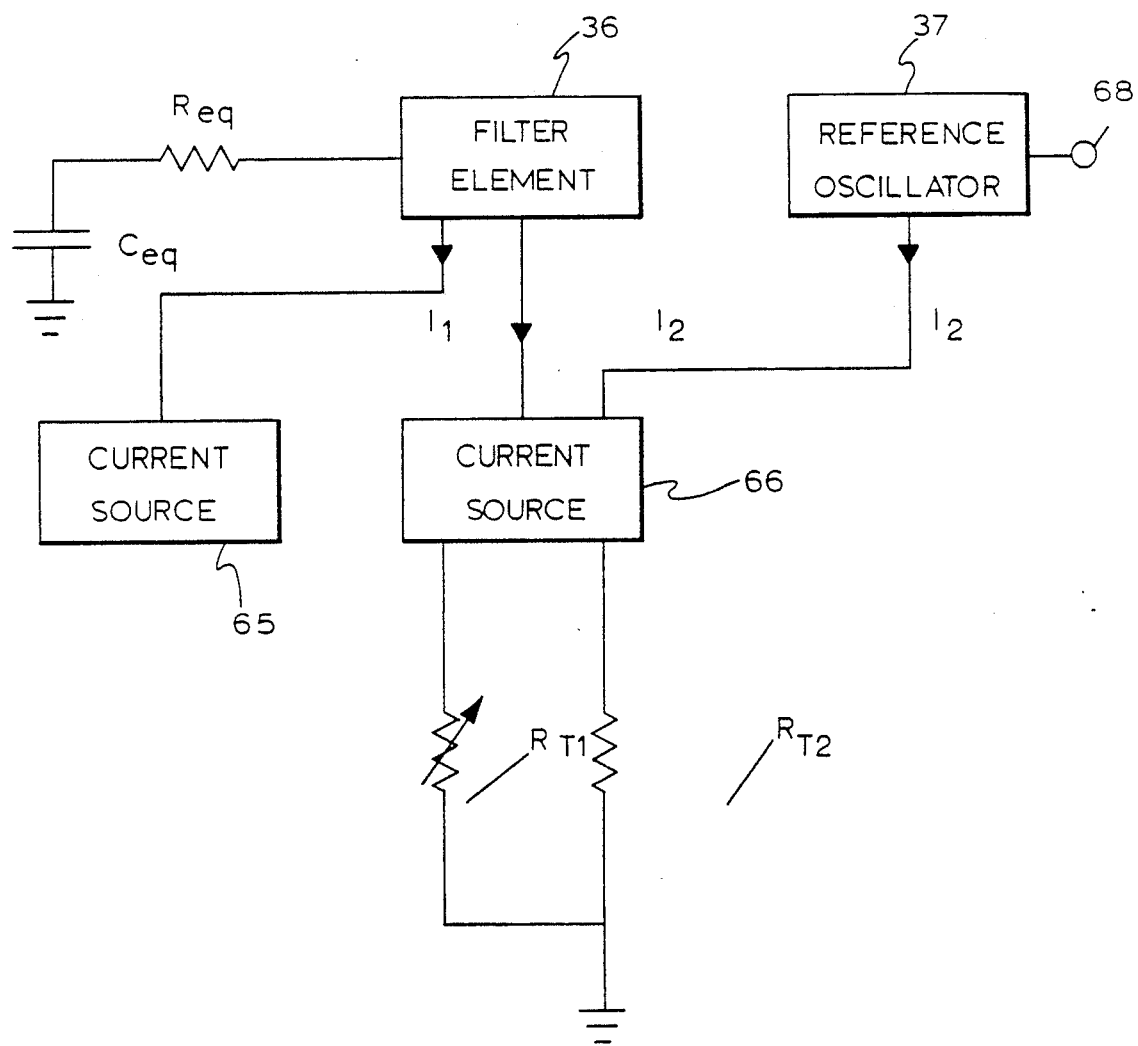
FIG. 3 is a block diagram of the present invention.

FIG. 3 is a block diagram illustrating the invention. The filter of the invention is implemented with at least one filter element 36 which has an equivalent resistance $R_{EQ}$ and an equivalent capacitance $C_{EQ}$. The accuracy of the filter is dependent upon the accuracy with which $R_{EQ}$ and $C_{EQ}$ can be known. There are techniques in the processing of integrated circuits which can be used to provide an $R_{EQ}$ which is suitably stable and accurate. However, the accuracy of the capacitance $C_{EQ}$ is difficult to control. The present invention provides a solution to this problem.

Current sources 65 and 66 provide currents $I_1$ and $I_2$ to filter element 36. It can be shown that the $R_{EQ}C_{EQ}$ of filter element 36 is dependent on currents $I_1$ and $I_2$. The current source 66 provides an $I_2$ which is dependent on a ratio of transistors $R_{T1}$ and $R_{T2}$. In the present invention, $R_{T1}$ is an adjustable resistor which can be trimmed using laser trimming or other suitable methods. In other embodiments of the invention, either or both of the resistors can be adjustable to compensate for variations in $C_{EQ}$. A reference oscillator 37 is coupled to current source 65 and current source 66. Power is provided to the oscillator 37 at pad 68. The reference oscillator 37 is used to tune the circuit to the desired frequency.

The reference frequency is monitored. The adjustable resistor $R_{T1}$ is then adjusted to correct for any variations between the desired frequency and the reference frequency. After the resistor $R_{T1}$ has been adjusted to compensate for variations in the capacitance $C_{EQ}$, the reference oscillator 37 is decoupled from the current sources. In this manner, a highly stable filter is provided without the use of a continuous reference frequency adding to background noise or the use of external resistors. In the preferred embodiment of the present invention, power is provided to the reference oscillator 37 at pad 68 during the adjusting process. Once the resistance has been adjusted, power is removed from the oscillator, disabling the oscillator during normal operation of the filter.

Figure 1:
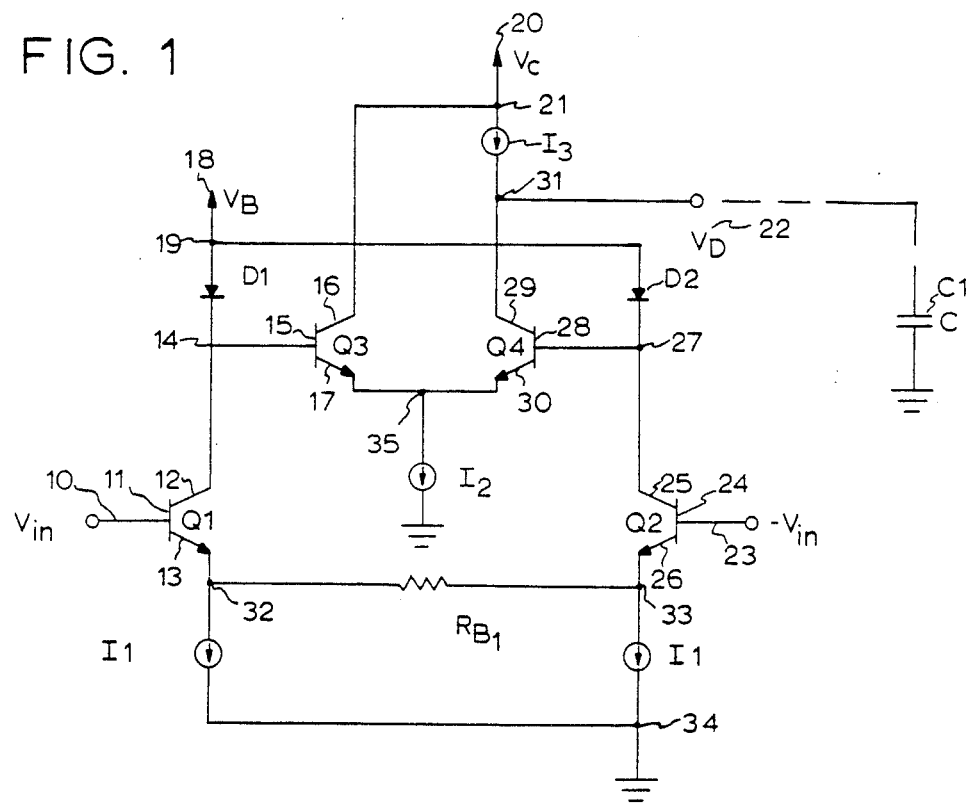
FIG. 1 is a circuit diagram of a transresistance amplifier.

FIG. 1 illustrates a transresistance amplifier (filter element) which may be used in the present invention. An input voltage $V_{in}$ 10 and negative $V_{in}$ 23 are provided to the bases 11 and 24 of transistors Q1 and Q2, respectively. Voltage $V_B$ 18 at node 19 is coupled through diode D1 to node 14. Node 14 is coupled to the collector 12 of transistor Q1. Node 14 is also coupled to the base 15 of transistor Q3.

The emitter 13 of transistor Q1 is coupled at node 32 to one terminal of current source $I_1$. The other terminal of current source of $I_1$ is coupled to ground at node 34. The emitter 17 of transistor Q3 is coupled at node 35 to one terminal of current source $I_2$. The other terminal of current source $I_2$ is coupled to ground.

Voltage $V_B$ 18 at node 19 is also coupled through diode D2 to node 27. Node 27 is coupled to the base 28 of transistor Q4. The emitter 30 of transistor Q4 is coupled to node 35. Voltage $V_C$ 20 at node 21 is coupled to the collector 16 of transistor Q3. Node 21 is also coupled to one terminal of current source $I_3$. The other terminal of current source $I_3$ at node 31 is coupled to the collector 29 of transistor Q4. Node 31 is also coupled to voltage $V_D$ 22. Voltage $V_D$ 22 is coupled through capacitor C1 to ground. Node 27 is coupled to the collector 25 of transistor Q2. The negative input voltage $-V_{in}$ 23 is coupled to the base 24 of transistor Q2. The emitter 26 of transistor Q2 is coupled to node 33. Node 33 is coupled through resistor $R_{B1}$ to node 32 and to current source $I_1$. The output of current source $I_1$ is also coupled through node 34 to ground.

The circuit of FIG. 1 comprises a differential input stage comprised of transistors Q1-Q4. A differential input ($V_{in}$ and $-V_{in}$ 23) is provided to the bases of transistors Q1 and Q2. The collector loads of transistors Q1 and Q2 are provided through diodes D1 and D2. Transistors Q3 and Q4 are base coupled to the collectors of transistors Q1 and Q2, respectively. The circuit of FIG. 1 is a filter section for implementation in the present invention. The filter section has an equivalent resistance:

$$R_{EQ}=(I1)(R_{B1})/(I_2) \qquad \text{(Equation 1)}$$

Figure 2:
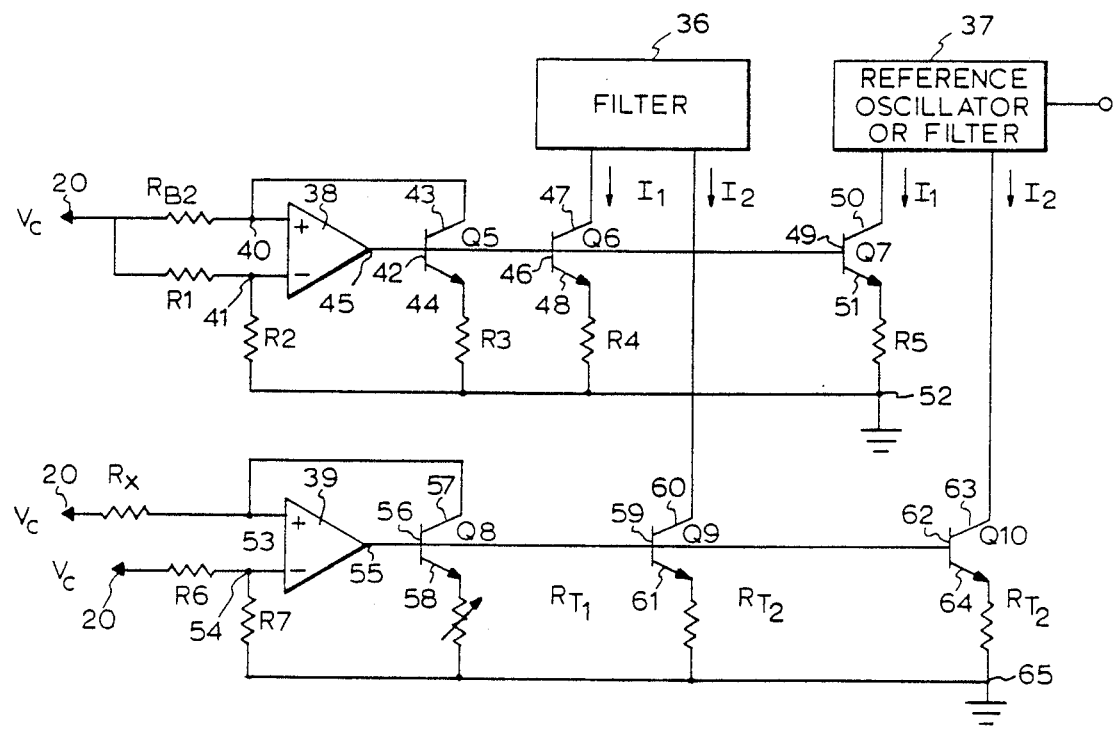
FIG. 2 is a circuit diagram of the preferred embodiment of the present invention.

FIG. 2 illustrates circuitry for providing currents $I_1$ and $I_2$. A voltage $V_C$ 20 is coupled through resistor $R_{B2}$ to the positive input of amplifier 38 at node 40. $V_C$ 20 is also coupled through resistor R1 to the inverting input of amplifier 38 at node 41. The output 45 of amplifier 38 is coupled to the base 42 of transistor Q5. The collector 43 of transistor Q5 is coupled in a feedback loop to node 40. Node 41 is coupled through resistor R2 to node 52 (ground).

The emitter 44 of transistor Q5 is coupled through resistor R3 to node 52. The output 45 of amplifier 38 is also coupled to the base 46 of transistor Q6. The collector 47 of transistor Q6 supplies $I_1$ to filter 36. The emitter 48 of transistor Q6 is coupled through resistor R4 to ground at node 52.

The output 45 of amplifier 38 is also coupled to the base 49 of transistor Q7. The collector 50 of transistor Q7 supplies current $I_1$ to reference oscillator 37. The emitter 51 of transistor Q7 is coupled through resistor R5 to ground at node 52.

$V_C$ 20 is coupled through resistor RX to the non-inverting input of amplifier 39 at node 53. $V_C$ 20 is also coupled through resistor R6 to the inverting input of amplifier 39 at node 54. Node 54 is coupled through resistor R7 to ground at node 65. The output 55 of amplifier 39 is coupled to the bases 56, 59 and 62 of transistors Q8, Q9 and Q10, respectively. The collector 57 of transistor Q8 is coupled in a feedback loop to the non-inverting input of amplifier 39 at node 53. The emitter 58 of transistor Q8 is coupled through a variable resistor $R_T1$ to ground at node 65.

The collector 60 of transistor Q9 supplies current $I_2$ to filter 36. The emitter 61 of transistor Q9 is coupled through resistor $R_T2$ to ground at node 65. The collector 63 of transistor Q10 supplies current $R_2$ to reference oscillator 37. The emitter 64 of transistor Q10 is coupled through resistor $R_T2$ to ground at node 65.

The filter section time constant is given by RC, where an analog multiplier is used so that:

$$R = I_1/(I_2)(gm) \qquad \text{(Equation 2)}$$

where $$1/gm = R_{B1} \qquad \text{(Equation 3)}$$

From FIG. 2, we see that:

$$I_1 \text{ equals } V_C/R_{B2} \text{ and} \qquad \text{(Equation 4)}$$

$$I_2 \text{ equals } AV_C/RX \qquad \text{(Equation 5)}$$

Thus, RC equals:

$$RC = (V_C)(R_{B1})(RX)C/(A)(R_{B2})(V_C) \quad \text{(Equation 6)}$$

where $R_{B1}$ and $R_{B2}$ are IC-based resistors which have large absolute value tolerance and closely match each other. $V_C$ equals power or reference voltage and A equals an adjustement factor.

An example of circuits that produce $I_1$ and $I_2$ is illustrated in FIG. 2.

$$\text{If } R_{B1} = K(R_{B2}) \quad \text{(Equation 7)}$$

$$RC = K(RX)C/A \quad \text{(Equation 8)}$$

The RC product can be made accurate because RX is an external resistor, K is a resistor ratio that is accurately produced on IC's and even though C has a wider than desired tolerance, the adjustment factor A can be trimmed to correct for its tolerance.

In FIG. 2, the adjustment factor A is the ratio of IC resistors RT 1 and RT2. The trimming of resistor RT1 is accomplished during wafer probe by changing the value of RT1 and/or RT2 by laser trimming or zener zapping in shunt resistors or other adjustment methods. The adjustment factor A also controls the frequency of a reference oscillator or other circuit that is similar to a filter section. By measuring the reference or measuring the filter response, A can be adjusted to its desired value. The reference oscillator or filter is off during normal operation. Note that $V_C/RX = I_2$ can be controlled by an external digital to analog converter, making the filter electronically programmable.

Thus, variations in the capacitance C of a filter element can be detected by providing a reference frequency and measuring the response of the filter. By adjusting a resistor ratio, this variation in performance can be compensated for so that a predictable response from the filter may be obtained. The reference frequency generating means can then be disabled so that no background noise interferes with signal detection and filtering.

It is not necessary for the oscillator to be integrated with the circuit in this invention. The filter response can be determined by direct measurement. Appropriate adjustment of the resistance RT1 can then be made to tune the filter.

Thus, a high frequency continuous time filter providing stable, predictable operation has been described.

I claim:

1. A continuous time filter circuit comprising:
   at least one filter element having a first equivalent resistance and a first equivalent capacitance, said first equivalent resistance dependent on a first and second current and the product of said first equivalent capacitance with said equivalent resistance dependent on a current ratio of said first and second currents;
   a first current generating means coupled to said filter element for generating said first current;
   a second current generating means coupled to said first filter element for generating said second current;
   said second current dependent on a ratio of resistance between a first resistor and a second resistor coupled to said second current generating means, said first resistor being an adjustable resistor;
   an oscillating means coupled only to said first and second current generating means during a first mode of operation, said oscillating means providing a reference frequency.

2. The circuit of claim 1 further including means of disabling said oscillating means during a second mode of operation of said filter.

3. The circuit of claim 2 wherein said second current is proportional to resistance of an external resistor.

4. The circuit of claim 3 wherein said first mode of operation occurs when said first resistor is being adjusted.

5. The circuit of claim 4 wherein said second mode of operation occurs when said first resistor is not being adjusted.

6. A continous filter circuit comprising;
   at least one filter element having a first equivalent resistance and a first equivalent capacitance having the product of said first equivalent capacitance with said first equivalent resistance dependent on a current;
   current generating means coupled to said filter element for generating said current, said current dependent on a ratio of a first resistance to a second resistance coupled to said current means, said first resistance being an adjustable resistance;
   reference oscillating means coupled to said current generating means during a first mode of operation for generating a reference frequency.

7. The circuit of claim 6 wherein said current is proportional to resistance of an external resistor.

8. The circuit of claim 7 wherein said reference oscillating means is disabled during a second mode of operation.

9. The circuit of claim 8 wherein said first mode of operation occurs when said first resistance is being adjusted.

10. The circuit of claim 9 wherein said second mode of operation occurs when said first resistance is not being adjusted.

11. A method for controlling the accuracy of a filter comprised of at least one filter element having an equivalent resistance and an equivalent capacitance, said equivalent capacitance dependent on a current, said method comprising the steps of:
    generating said current such that said current is dependent on a ratio of the resistance of first and second resistors;
    comparing a reference frequency to a frequency of said filter during a first mode of operation of said filter;
    adjusting said current by adjusting at least one of said first and second resistors to allow said frequency of said filter to be approximately equal to said reference frequency;
    withholding said reference frequency during a second mode of operation of said filter;
    whereby said frequency of said filter is accurately established.

12. The method of claim 11 wherein said step of disabling said reference frequency is accomplished by removing power from a reference frequency generating means coupled to a said filter.

13. The circuit of claim 11 wherein said current is proportional to resistance of an external resistor.

14. The circuit of claim 13 wherein said first mode of operation occurs when said first resistor is being adjusted.

15. The circuit of claim 14 wherein said second mode of operation occurs when said first resistor is not being adjusted.